US006459797B1

(12) United States Patent
Ashour et al.

(10) Patent No.: US 6,459,797 B1
(45) Date of Patent: Oct. 1, 2002

(54) AUDIO MIXER

(75) Inventors: Gal Ashour, Yokneam Illit; Dan Chazan; Ronen Ozer, both of Haifa, all of (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/053,454

(22) Filed: Apr. 1, 1998

(51) Int. Cl.[7] ............................ H04R 5/00; H04R 5/02; H04B 1/00; H03G 3/00

(52) U.S. Cl. ......................... 381/18; 381/119; 381/107; 381/307

(58) Field of Search ........................... 381/18, 119, 307, 381/107

(56) References Cited

U.S. PATENT DOCUMENTS 5,212,733 A * 5/1993 DeVitt et al. ............... 381/119
5,812,688 A * 9/1998 Gibson ....................... 381/119
5,857,026 A * 1/1999 Scheiber ...................... 381/18
5,912,976 A * 6/1999 Klayman et al. .............. 381/1
6,088,461 A * 7/2000 Lin et al. .................... 381/104

* cited by examiner

*Primary Examiner*—Forester W. Isen
*Assistant Examiner*—Laura A. Grier
(74) *Attorney, Agent, or Firm*—Andrew J. Dillon

(57) ABSTRACT

An audio mixer system is described for producing coded output in which at least a left audio signal, a right audio signal and a surround audio signal are encoded in two output channels so that the surround signal can be decoded from the difference of the two output channels. The system comprises means for generating position data designating a desired position for a sound source in a 360 degree sound field. Logic is provided for determining the relative volume of the sound source in the left, right and surround audio signals from the position data. A signed continuity factor is maintained so that the sign of the continuity factor is changed in response the desired position crossing a nominal position of the surround signal in the sound field and logic is provided for encoding the sound source data into the two output channels in accordance with the determined relative volume of the sound source in at least two of the left, right and surround signals each multiplied by the continuity factor. This reduces audible artifacts associated with phase discontinuities in the output signals either side of the surround speaker nominal position.

5 Claims, 4 Drawing Sheets

AUDIO MIXER

BACKGROUND OF THE INVENTION

1. Technical Field

The invention relates to an audio mixer system for generating coded audio data with a sound source at a desired location.

2. Description of the Related Art

Quadrophonic audio systems are known which enable four audio input signals to be matrix encoded into two conventional stereo channels which are then decoded back to four audio output signals for playback.

In one well known such system, which has been commercialized as the Dolby Pro Logic system (Dolby and Pro Logic are trademarks of Dolby Laboratories Inc), the four channels correspond to the conventional stereo speakers placed at the front left and right corners of a room, together with a speaker placed at the center of the front stage and one or more surround speakers placed generally to the rear of the listener. These four channels are encoded into a stereo data stream as follows. The signals for the left and right speakers are placed in conventional fashion into the left and right stereo channels. The center signal is encoded in equal amounts into both left and right channels. The surround signal is also encoded in equal amounts into both left and right channels, but with a 180 degree phase shift between the information being encoded into the two channels, so that the surround signal can be recovered from the difference between them.

For such systems active decoding technology has become available which enables the four channels to be recovered with acceptable levels of crosstalk between the channels to generate an illusion of a 360 degree sound field.

Whilst static mixing of audio signals from sound sources at different locations into an encoded data stream of this type is relatively simple, a problem arises if it is desired to allow any particular sound source to be moved around in real time within the 360 degree field. This is because whenever the sound source crosses the nominal location of the surround speaker there is a phase discontinuity between the signals generated with the sound source just to either side of the surround speaker position. This discontinuity can result in an audible click, which is annoying for the user.

SUMMARY OF THE INVENTION

It is an object of the present invention to provide an audio mixer for generating coded data having a sound source at a desired and controllable location and which does not suffer from the above artifact.

In brief, this is achieved by an audio mixer system for producing coded output in which at least a left audio signal, a right audio signal and a surround audio signal are encoded in two output channels so that the surround signal can be decoded from the difference of the two output channels. The system comprises means for generating position data designating a desired position for a sound source in a 360 degree sound field. Logic is provided for determining the relative volume of the sound source in the left, right and surround audio signals from the position data. A signed continuity factor is maintained so that the sign of the continuity factor is changed in response the desired position crossing a nominal position of the surround signal in the sound field and logic is provided for encoding the sound source data into the two output channels in accordance with the determined relative volume of the sound source in at least two of the left, right and surround signals each multiplied by the continuity factor.

In a preferred embodiment, user input means are provided for allowing a user to designate the desired position. Preferably, the user input means comprises means to generate a window on a display screen and pointer means to manipulate an icon within the window to indicate a desired position for the sound source. The icons can be in the form of images representing musical instruments associated with the sound source.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF ILLUSTRATIVE EMBODIMENT

Figure 1:
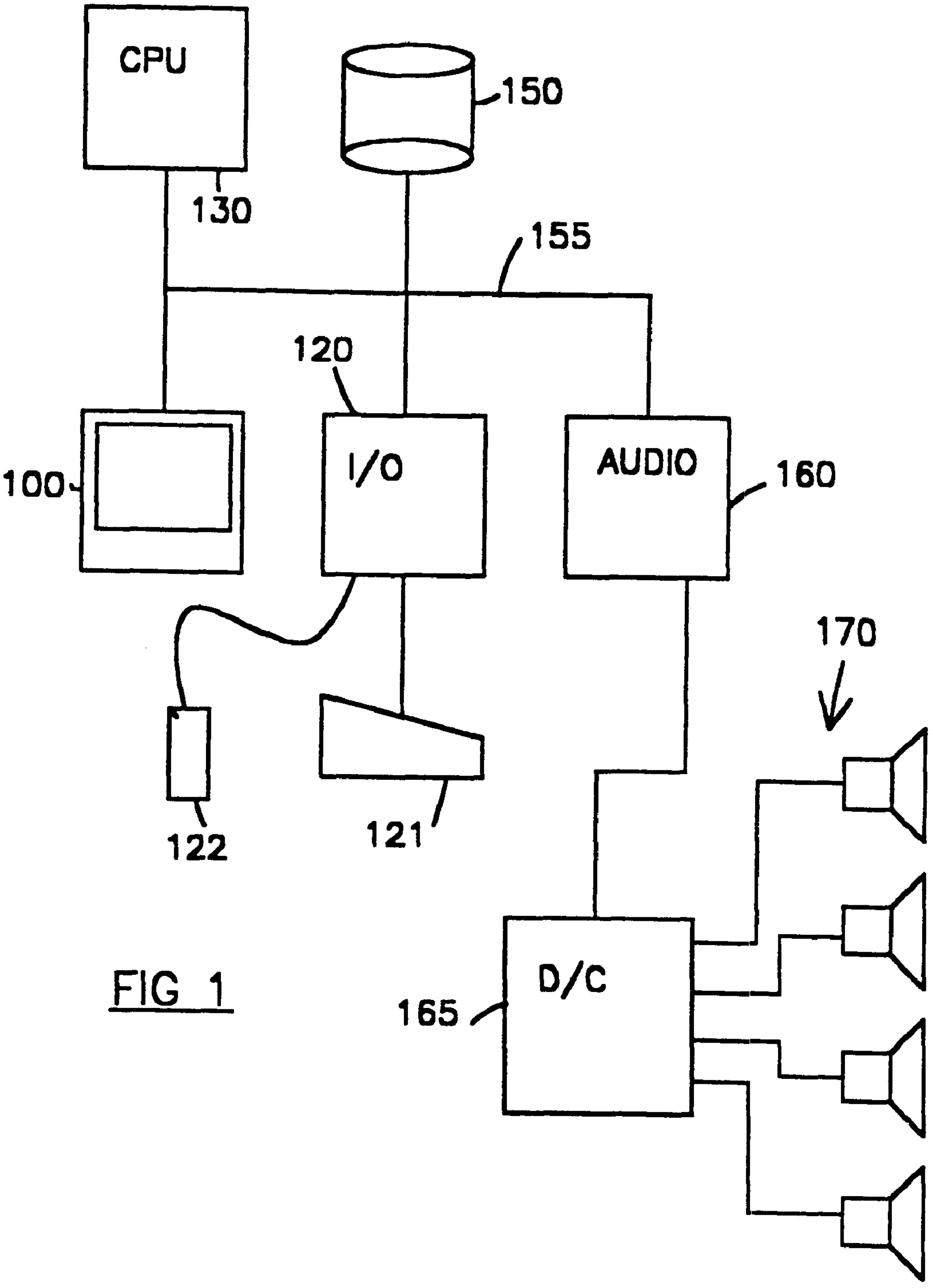
FIG. 1 is a schematic diagram showing a personal computer including an audio adapter.

FIG. 1 is a schematic diagram showing a personal computer arranged to function as an audio synthesizer which includes an audio mixer. The computer comprises conventional components such as display device 100 together with an associated display adapter (not shown), and I/O interface 120 to which is attached a keyboard 121 and a mouse 122. The computer also comprises a CPU 130, and a magnetic storage device 150. These components are arranged to intercommunicate via a bus 155 in conventional manner.

The computer also comprises an audio adapter 160 which is capable of implementing an audio synthesizer by utilizing a digital signal processor. Audio adapter 160 is shown connected to a decoder 165 and loudspeakers indicated at 170.

The system shown in FIG. 1 may, for example, be implemented by using an IBM Personal Computer 350 computer available from IBM Corporation and a SoundBlaster 16 Value Edition sound card available from Creative Labs Inc (IBM is a trademark of IBM Corporation and SoundBlaster is a trade mark of Creative Technology Inc).

Figure 2:
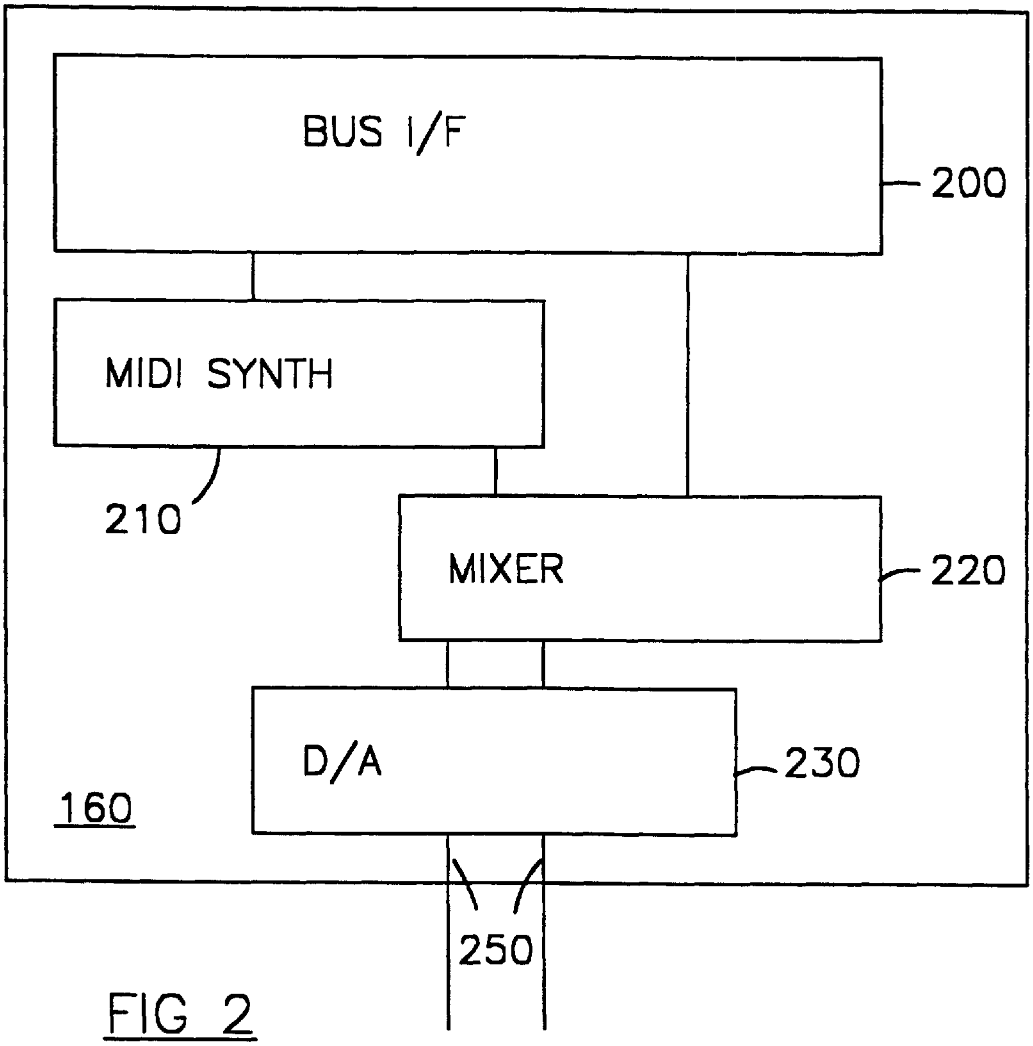
FIG. 2 is a simplified functional block diagram showing relevant parts of the audio adapter of FIG. 1.

FIG. 2 is a simplified functional block diagram showing the relevant parts of adapter 160. It comprises bus interface logic 200, MIDI synthesizer 210, digital mixer 220, and digital to analog converter 230. MIDI (Musical Instrument Digital Interface) is an internationally recognized specification for data communication between digital electronic musical instruments and other devices, such as computers, lighting controllers, mixers or the like. The MIDI data specifies performance information, as opposed to sound information. For example, which note or notes are being held down, if any additional pressure is applied to the note after being struck, when the key is released and any other adjustments made to the settings of the instrument. MIDI data is communicated as a serial data stream organised into MIDI ‘messages’, which contain one MIDI command or event.

In a conventional MIDI playback system, a MIDI synthesizer is controlled by a stream of MIDI messages. The synthesizer receives and decodes the messages and operates accordingly. For example, a 'NOTE ON' event will cause the synthesizer to generate audio samples that correspond to a requested note and velocity that are supplied as parameters. Similarly, a 'NOTE OFF' event will cause the synthesizer to cease generating the audio samples.

Most commercially available sound cards have the capability of acting as MIDI synthesizers by receiving data from MIDI sources either though a MIDI port or via the PC bus.

MIDI synthesizer 210 could be any suitable kind of synthesizer, eg an FM synthesizer or a wavetable or waveguide synthesizer. MIDI synthesizer 210 takes a MIDI data stream as input and generates in known fashion digital samples representing a number of instruments, which are then combined in mixer 220 in the manner to be described below to generate a stereo output which can be decoded by a Pro Logic decoder.

The card has audio outputs indicated at 250, though the audio samples might equally be output in digital form for digital recording or processing via an external D/A converter.

The structure and general operation of an audio card of the type described above will be well known to those skilled in the art.

The overall operation of the audio card 160 is controlled via suitable software which runs on the computer. Part of the function of the software is to control digital mixer 220 in order to enable the instrumental sounds generated by MIDI synthesizer 210 to be placed anywhere within a 360 degree sound field.

Of course, it will be understood that the techniques described here could also be applied to any other kind of audio data which it is desired to position in a 360 degree sound field, however such data is generated.

Figure 3:
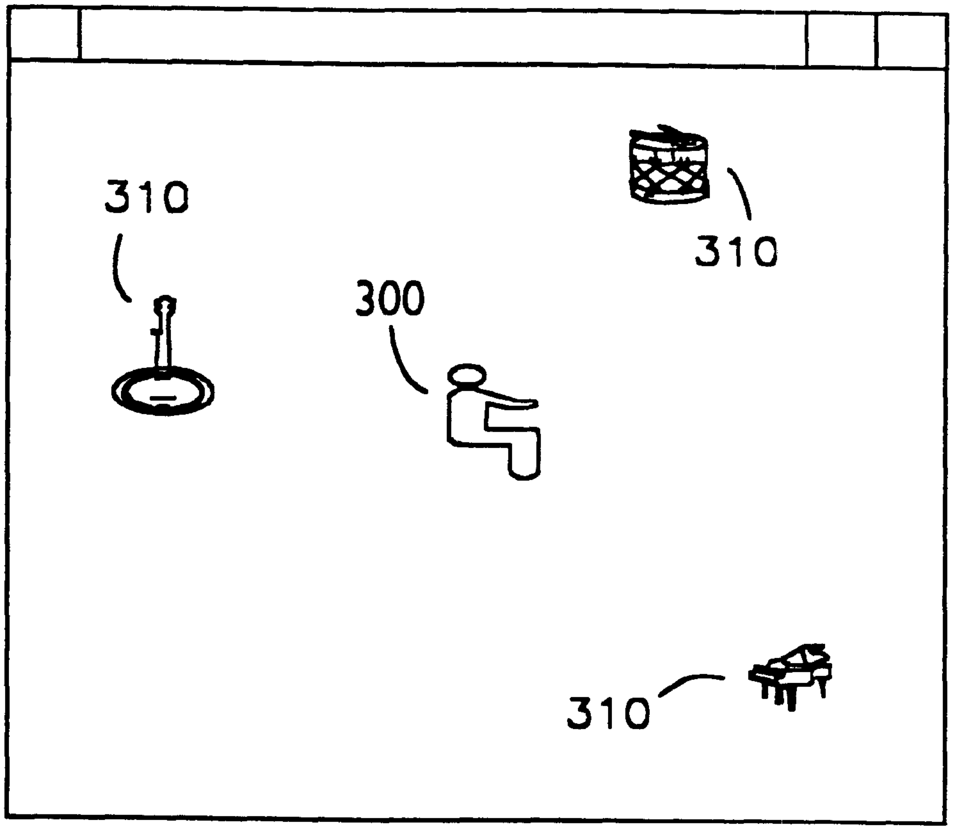
FIG. 3 shows in simplified schematic form a window of a user interface in the computer of FIG. 1.

This control is effected by via a user interface program which displays in a window an image of a room at which the listener is at the center. FIG. 3 shows in simplified schematic form a window of this type. The listener at the centre of the room is represented by the image 300. Instrumental sounds are represented by iconic images of the instrument concerned as illustrated in FIG. 3 by icons 310. The iconic images 310 can be positioned and repositioned in well known fashion using mouse 122 in order to move the sounds within the 360 degree sound field.

In the present implementation of the invention there are a total of sixteen instruments which may be synthesized simultaneously by synthesizer 210. These are represented by 16 icons which may be manipulated in order to position the sound from the 16 instruments.

It will be undestood that the position information need not necessarily be generated through a dedicated graphical user interface, but could be generated in other ways. For example, the position information could be generated by a computer game application and streamed to the synthesizer using a standard Application Programming Interface set, such as the DirectSound API set defined by Microsoft Inc.

The method used to place the digital data streams generated for each instrument by synthesizer 210 will be described below.

Figure 4:
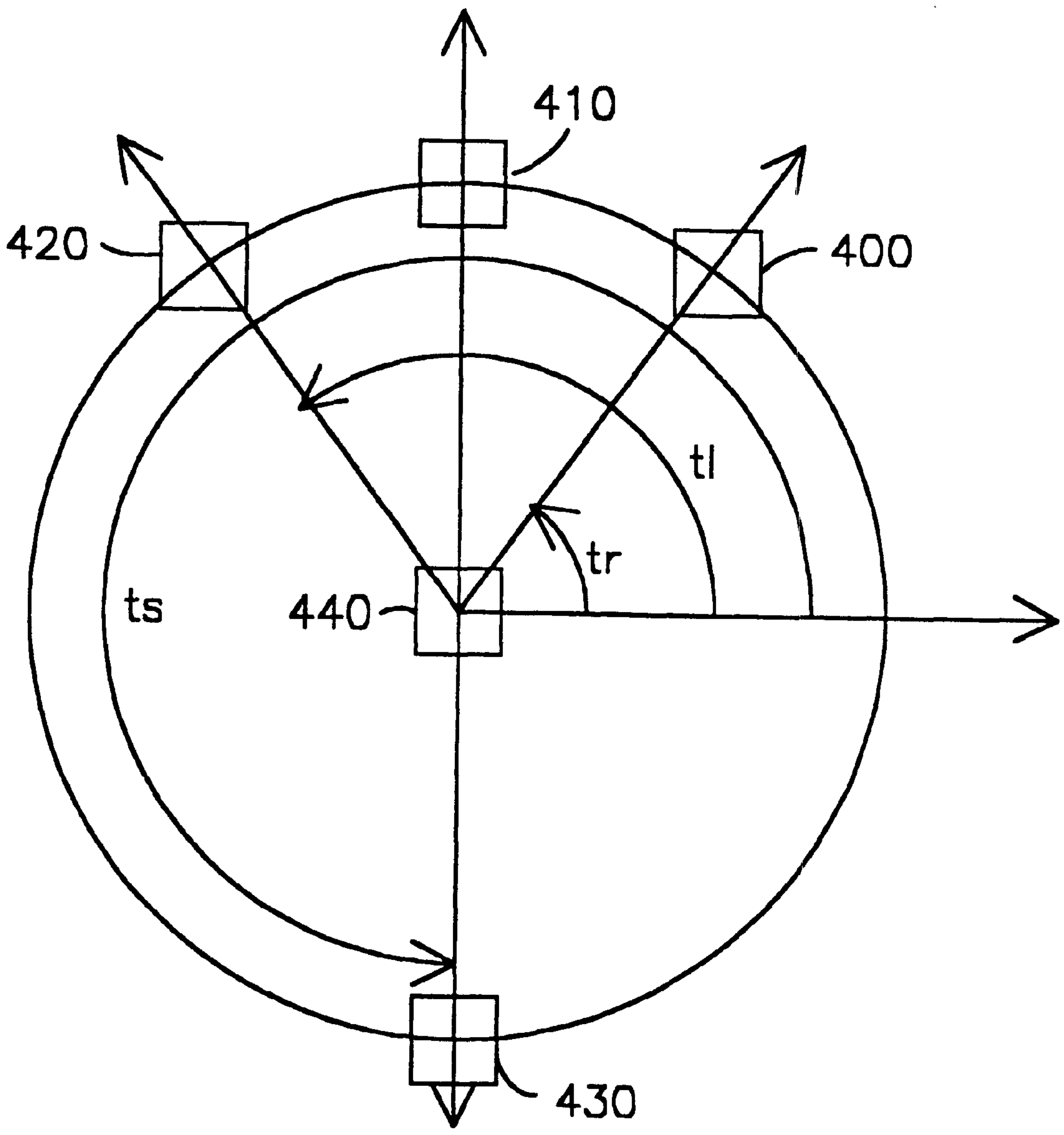
FIG. 4 illustrates the speaker arrangement in a Dolby Pro Logic system.

The Dolby Pro Logic system is a quadraphonic sound system which employs 4 speakers named left, right, center and surround. The speakers nominally lie on a circle with the listener at the center. This arrangement is shown in FIG. 4, in which loudspeakers 400, 410, 420 and 430 surround listener 440.

The Dolby Pro Logic system is described in detail in publications available from Dolby Laboratories Inc., including an article which was available for public viewing on the Internet dated on Mar. 27, 1997 and entitled 'Dolby Pro Logic Surround Decoder Principles of Operation' by Roger Dressler, which is included herein by reference and a copy of which has been supplied for inclusion on the European Patent Office file for the present application.

The center speaker is represented only in the speaker physical domain. When the spatial location is such that the sound source is located between the left and right speaker, the Pro Logic decoder can distribute the sound between the left speaker, the center speaker, and the right speaker using predefined filters.

Consequently, only the left, right and surround speakers need be considered when encoding audio data from a sound source in a stereo data stream.

The angular positions of the left, right and surround speakers are labelled tr, tl and ts respectively.

The convention adopted is that the angle 0 lies to the right of the listener.

The instruments are all represented in a polar coordinate system whose center is the listener. A instrument is said to lie between the right and left speakers if it lies in the angular sector defined by the radius vectors to the right and left speaker locations, containing the forward looking direction. The latter is as $\pi/2$ by convention. The remaining sectors define locations for which the instrument is between the right speaker or the left speaker and the surround speaker.

Location data for each instrument is generated by the user interface program from the location of the corresponding icon in relation to the position of the listener. If the position of the icon changes this location data will be communicated to the software which controls mixer 220.

A single instrument with amplitude A at location (rm, tm), where rm is its distance from the listener and tm is its angular position, generates sound levels and phases at the three speakers according to the Dolby Pro Logic algorithms as described below.

The energy from each sound source, ie each instrument, is allocated to the two speakers which define the angular sector containing that source, ie if the angular position tm lies between tr and tl, the energy is allocated solely to the left and right speakers, if tm lies between tl and ts then the energy is allocated solely to the left speaker and to the surround speaker. If tm lies between o and tr or between ts and $2/\pi$, then the energy is allocated solely to the right and surround speakers. In the following description, the two speakers to which the energy is allocated will be designated a and b, and the third speaker to which no energy is allocated will be designated c.

The volume of each speaker Va, Vb is proportional to its angular distance from that source. The volume of the third speaker Vc is zero. If ta and tb are respectively the angular locations of the speakers a and b, then the volume of the source in each speaker is as follows:

$$Va\ abs\ (tb-tm),\ Vb\ abs\ (ta-tm)$$

Va and Vb are normalised by the L2 norm of the vector (Va, Vb) and the radial distance is used to ensure the sound volume factors are proportional to 1/rm. In order to avoid saturation whenever rm is greater than a threshold value rSAT it is replaced by the threshold value rSAT.

The resulting equations are as follows:

if rm<rSAT then rm=RSAT, $$Va = \frac{rl\ \mathrm{abs}(tb - tm)}{rm\sqrt{(tb-tm)^2 + (ta-tm)^2}}$$

$$Vb = \frac{rl\ \mathrm{abs}(ta - tm)}{rm\sqrt{(tb-tm)^2 + (ta-tm)^2}}$$

$$Vc=0$$

where rl is a scale factor nominally representing the distance at which the sound source should not be amplified.

To produce the proper sound using the volumes Va, Vb, Vc, the mono signal is coded into a stereo stream to comply with the Dolby Prologic coding. This coding is performed by multiplying the mono source amplitude A by a signed factor Sr to produce the stereo right stream, and by Sl to produce the stereo left stream. These factors a re computed as follows:

$$\begin{bmatrix} Sl \\ Sr \end{bmatrix} = Va\begin{bmatrix} A_l \\ A_r \end{bmatrix} + Vb\begin{bmatrix} B_l \\ B_r \end{bmatrix}$$

(Al, Ar) and (Bl, Br) are speaker coding factors which are defined by the type of speaker that Va and Vb represents as follows:

$$a = L,\ b = R:\ \begin{bmatrix} A_l \\ A_r \end{bmatrix} = CF\begin{bmatrix} Fl \\ 0 \end{bmatrix}, \begin{bmatrix} Bl \\ Br \end{bmatrix} = CF\begin{bmatrix} 0 \\ Fr \end{bmatrix}$$

$$a = R,\ b = S:\ \begin{bmatrix} A_l \\ A_r \end{bmatrix} = CF\begin{bmatrix} 0 \\ Fr \end{bmatrix}, \begin{bmatrix} Bl \\ Br \end{bmatrix} = CF\begin{bmatrix} -Fs \\ Fs \end{bmatrix}$$

$$a = L,\ b = S:\ \begin{bmatrix} A_l \\ A_r \end{bmatrix} = CF\begin{bmatrix} Fl \\ 0 \end{bmatrix}, \begin{bmatrix} Bl \\ Br \end{bmatrix} = CF\begin{bmatrix} Fs \\ -Fs \end{bmatrix}$$

Fl, Fr and Fs are volume factors representing an overall sound level for the left, right and surround speakers respectively. These volume factors are the same for all the instruments.

CF is a signed continuity factor which can be either −1 or 1. A separate continuity factor CF is maintained for each sound source. To ensure continuity of Sl and Sr, each time the sound source crosses the angle ts of the surround speaker, ie if tm changes from being less than ts to being greater than ts, the sign of CF is changed.

This measure avoids the discontinuity in Sl and Sr which would otherwise arise since Bl would change from Fs to −Fs and Br from −Fs to Fs, Va being equal to zero near the nominal position of the surround speaker.

Initially CF is set to 1.

The digital data streams ASl and ASr from each instrument are simply added together to generate an output stereo data stream at which each instrument is at a desired position and the positions of the instruments are each dynamically controllable via the user interface program.

As will be clear from the above description, the present implementation takes the form of a computer program for use with standard commercially available hardware components and can be distributed in the form of an article of manufacture comprising a computer usable medium in which suitable program code is embodied for causing a computer to perform the functions described above. Of course, the invention could equally be implemented as hardware or as any combination of hardware and software.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An audio mixer system for producing coded output in which at least a left audio signal, a right audio signal and a surround audio signal are encoded in two output channels so that the surround signal can be decoded from the difference of the two output channels, the system comprising:

means to generate position data designating a desired position for a sound source in a 360 degree sound field;

logic for determining the relative volume of the sound source in the left, right and surround audio signals from the position data;

means arranged to maintain a signed continuity factor so that the sign of the continuity factor is changed in response to the desired position crossing a nominal position of the surround signal in the sound field; and logic for encoding the sound source data into the two output channels in accordance with the determined relative volume of the sound source in at least two of the left, right and surround signals each multiplied by the continuity factor.

2. An audio mixer system as claimed in claim 1 wherein the means to generate the position data includes user input means for allowing a user to designate a position.

3. An audio mixer system as claimed in claim 2 wherein the user input means comprises means to generate a window on a display screen and pointer means to manipulate an icon within the window to indicate a desired position for the sound source.

4. An audio mixer system as claimed in claim 3 arranged to generate icons in the window in the form of images representing musical instruments associated with the sound source.

5. A method for producing coded output in which at least a left audio signal, a right audio signal and a surround audio signal are encoded in two output channels so that the surround signal can be decoded from the difference of the two output channels, the method comprising:

generating position data designating a desired position for a sound source in a 360 degree sound field;

determining the relative volume of the sound source in the left, right and surround audio signals from the position data;

maintaining a signed continuity factor so that the sign of the continuity factor is changed in response to the desired position crossing a nominal position of the surround signal in the sound field; and encoding the sound source data into the two output channels in accordance with the determined relative volume of the sound source in at least two of the left, right and surround signals each multiplied by the continuity factor.

* * * * *